United States Patent [19]
Obregon et al.

[11] Patent Number: 5,276,362
[45] Date of Patent: Jan. 4, 1994

[54] BICMOS TTL TO CMOS LEVEL TRANSLATOR

[75] Inventors: Carlos D. Obregon, Phoenix; Daniel T. Bizuneh; Vikrant Chaudhry, both of Tempe; Michael A. Wells, Chandler, all of Ariz.

[73] Assignee: Motorola, Inc., Schaumburg, Ill.

[21] Appl. No.: 879,646

[22] Filed: May 6, 1992

[51] Int. Cl.$^5$ ............... H03K 19/08; H03K 19/0175; H03K 19/01
[52] U.S. Cl. .................... 307/446; 307/443; 307/475
[58] Field of Search ............... 307/475, 264, 446, 570, 307/443, 475, 264, 446, 570

[56] References Cited

U.S. PATENT DOCUMENTS

| | | | |
|---|---|---|---|
| 4,501,978 | 2/1985 | Gentile et al. | 307/475 |
| 4,584,491 | 4/1986 | Ulmer | 307/475 |
| 4,593,212 | 6/1986 | Svager | 307/475 |
| 4,705,965 | 11/1987 | Stuyt | 307/272.2 |
| 4,717,847 | 1/1988 | Nolan | 307/475 |
| 4,791,323 | 12/1988 | Austin | 307/475 |
| 5,019,726 | 5/1991 | Guo | 307/446 |
| 5,087,841 | 2/1992 | Rogers | 307/475 |
| 5,117,131 | 5/1992 | Ochi et al. | 307/475 |
| 5,144,167 | 9/1992 | McClintock | 307/475 |
| 5,146,118 | 9/1992 | Nakamura et al. | 307/475 |

Primary Examiner—Edward P. Westin
Assistant Examiner—Benjamin D. Driscoll
Attorney, Agent, or Firm—Joe E. Barbee; Robert F. Hightower

[57] ABSTRACT

The present invention includes a circuit having an input section that is operated from an operating voltage which is lower than a supply voltage of the circuit. The operating voltage is established so that the operating voltage minus the voltage of a high level TTL signal is less than an upper level threshold voltage of the input section. The circuit couples the output of the input section to the supply voltage thereby increasing the voltage on the output of the input section to a voltage greater than the operating voltage. In addition, the circuit enables a current source during a portion of a low-to-high transition on an output of the circuit. The current source provides high current drive during the portion of the transition. Since the current source is only enabled during the portion of the transition, static power dissipation is minimized.

17 Claims, 1 Drawing Sheet

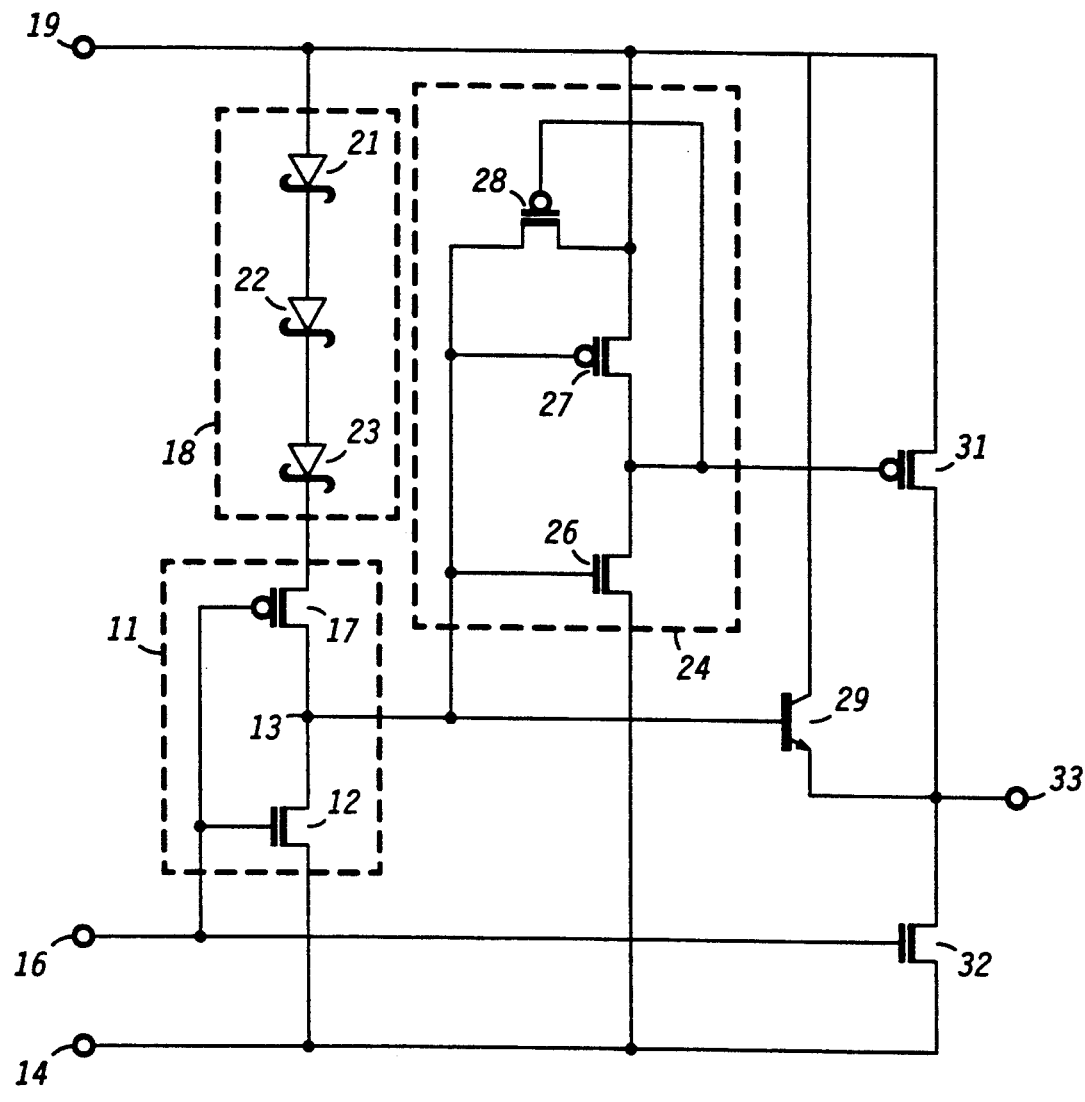

BICMOS TTL TO CMOS LEVEL TRANSLATOR

BACKGROUND OF THE INVENTION

The present invention relates, in general, to electrical circuits, and more particularly, to a novel electrical circuit having low static power dissipation and high output current.

In the past, a variety of circuit configurations have been utilized to provide complementary metal oxide semiconductor (CMOS) circuits which are capable of accepting transistor-transistor logic (TTL) voltage levels. The semiconductor industry has also combined CMOS with bipolar to form BICMOS circuits having TTL compatible inputs. One notable disadvantage of most, if not all, such prior circuits is the amount of power dissipated by the circuits' input stage. The voltage value of a TTL signal generally varies over a large range, and often drops to a level that is insufficient to disable the prior circuits' input transistors. When this occurs, excessive power is dissipated in the form of leakage current flowing through these input transistors.

In addition, the prior circuits generally have a small output current that limits the circuits' switching speed. In some cases, these prior circuits have utilized bipolar output transistors to provide increased output current. The bipolar output transistors generally consume power when the circuit is in a static (non-switching) condition, thus, resulting in high static power dissipation.

Accordingly, it is desirable to provide a circuit that has an input which operates with a TTL input signal, that has low static power dissipation, and that has a large output current.

SUMMARY OF THE INVENTION

Briefly stated, the present invention includes a circuit having an input section that is operated from an operating voltage that is lower than a supply voltage of the circuit. The operating voltage is established so that the operating voltage minus the voltage of a high level TTL signal is less than an upper level threshold voltage of the input section. The circuit couples the output of the input section to the supply voltage thereby increasing the voltage on the output of the input section to a voltage greater than the operating voltage. In addition, the circuit enables a current source during a portion of a low-to-high transition on an output of the circuit. The current source provides high current drive during the portion of the transition. Since the current source is only enabled during the portion of the transition, static power dissipation is minimized.

BRIEF DESCRIPTION OF THE DRAWINGS

The sole Figure schematically illustrates an embodiment of an electrical circuit in accordance with the present invention.

DETAILED DESCRIPTION OF THE DRAWINGS

The sole Figure schematically illustrates a BICMOS circuit 10 which provides translation of a TTL level signal to a CMOS level signal at an output 33 of circuit 10. Also included in circuit 10 is an input circuit 11 and a level shifter 18. Input circuit 11 has a pair of complementary metal oxide semiconductor (CMOS) cascaded transistors 12 and 17 connected to function as an inverter. The TTL signal is applied to transistors 12 and 17 through a connection between an input 16 of circuit 10 and a gate of each transistor 12 and 17. Transistor 12 also has a source connected to a voltage return terminal or voltage return 14, and a drain connected to both a pull-up node 13 and a drain of transistor 17. A source of transistor 17 is connected to an output of a shifter means or level shifter 18 in order to provide an operating voltage to circuit 11. Shifter 18 derives the operating voltage through a connection between an input of shifter 18 and a voltage supply terminal of circuit 10 or voltage supply 19.

In order to obtain low static power dissipation in input circuit 11, it is important that transistor 17 remain disabled when a high level TTL signal is applied to input 16. Since the high level TTL signal may have a voltage as low as 2.4 volts, transistor 17 must remain disabled at such an applied voltage. It has been found that in order to completely disable transistor 17 the threshold voltage of transistor 17 must be greater than the high level TTL signal's voltage minus the operating voltage. This condition provides circuit 11 with a high level or upper level threshold voltage that minimizes static power dissipation. If the operating voltage is too large, transistor 17 is slightly enabled and provides a leakage current path that increases static power dissipation. Level shifter 18 provides such an operating voltage to circuit 11.

In the preferred embodiment, the operating voltage is obtained by dropping a portion of the voltage from supply 19 across three series connected Schottky diodes 21, 22, and 23. Diodes 21, 22, and 23 provide a voltage drop between approximately 1.2–1.8 volts, thus, providing an operating voltage between approximately 2.7 and 4.3 volts. Series connected Schottky diodes 21, 22, and 23 are configured with diode 21 having an anode connected to supply 19, and a cathode connected to an anode of diode 22. Diode 23 has an anode connected to a cathode of diode 22, and a cathode connected to the source of transistor 17. This configuration of three Schottky diodes provides an optimum operating voltage that reduces leakage current and static power dissipation when compared to prior power reduction circuits. Level shifter 18 can be formed from a variety of other devices as long as the high level TTL signal's voltage minus the operating voltage is less than the threshold voltage ($V_{TP}$) of transistor 17. For example two P-N diodes may be utilized instead of three Schottky diodes. It is believed that a single P-N diode provides an excessively high operating voltage that results in high leakage current and high static power dissipation.

When a high level TTL signal is applied to input 16, transistor 17 is completely disabled thereby substantially eliminating the flow of leakage current through transistor 17. Consequently, static power dissipation in circuit 11 is minimized. When a low level TTL signal is applied to input 16, transistor 12 is disabled and transistor 17 is enabled thereby coupling the operating voltage to node 13. Since the value of the operating voltage is lower than the normal voltage value of a high level signal within circuit 10, hereinafter referred to as a high, a restore means or restore circuit 24 is provided to function as a means for restoring the voltage level of node 13 to the voltage of a normal high. In addition, restore circuit 24 also has an output that is used to enable an upper output transistor 31. Restore circuit 24 can have a variety of configurations that responds to a reduced high level voltage applied to node 13 and subsequently increases the voltage applied to node 13 to the voltage of a high.

In the preferred embodiment, restore circuit 24 includes a feedback transistor 28 and inverter connected transistors 26 and 27. Pull-up node 13 is connected to a drain of transistor 28 and to a gate of each transistor 26 and 27. Also, transistor 26 has a source connected to return 14, and a drain connected to the output of circuit 24. Transistor 27 has a drain connected to the drain of transistor 26, and a source that is connected to both supply 19 and a source of transistor 28. When transistor 17 applies the operating voltage, minus the voltage drop of transistor 17, to node 13, transistor 26 is enabled and couples the gate of transistor 28 to return 14 thereby enabling transistor 28 and coupling supply 19 to node 13. To ensure transistor 17 enables transistor 26, transistors 26 and 27 are formed with a channel width ratio that provides transistor 26 with sufficient gain to pull the output of circuit 24 low at the reduced voltage value supplied by transistor 17. In this preferred embodiment, transistors 27 and 26 have a channel width ratio of 1:4.

Once transistor 28 is enabled, circuit 24 forms a latch that keeps transistor 28 enabled. To ensure that transistor 28 can be disabled, transistor 28 is formed so that transistor 12 can pull node 13 low even while transistor 28 is enabled. In the preferred embodiment, transistor 28 has a channel length approximately three times the channel length of transistor 12. Consequently, when transistor 12 applies a low to node 13, transistor is disabled while transistor 27 is enabled, thus, disabling transistor 28.

In addition to the connection between the output of circuit 24 and the gate of transistor 31, transistor 31 also has a source connected to supply 19, and a drain connected to an output terminal of circuit 10 or output 33. A lower output transistor 32 has a source connected to return 14 and a drain connected to output 33. To provide a rapid high-to-low transition on output 33, transistor 32 has a gate connected to input 16 thereby bypassing the internal delay stages of circuit 10. Circuit 10 provides high drive current during low-to-high transitions on output 33 with a bipolar current source transistor 29. Transistor 29 has an emitter connected to output 33, a collector connected to supply 19, and a base connected to node 13. When a low level TTL signal is applied to input 16, transistor 17 applies the operating voltage to node 13 thereby enabling transistor 29 while the output of circuit 24 enables transistor 31. Once transistors 29 and 31 are enabled, the voltage on output 33 increases until the voltage reaches a predetermined value that disables transistor 29. In the preferred embodiment, the predetermined value is approximately the voltage applied to supply 19 minus the base-emitter voltage ($V_{BE}$) of transistor 29 or between approximately 3.6 and 4.8 volts. After transistor 29 is disabled, transistor 31 remains enabled. Consequently, transistor 29 provides high current drive during the low-to-high transition of output 33, but is subsequently disabled thereby dissipating no static power. This low power, high current function provides a significant advantage over prior circuits.

Further, transistor 31 provides temperature compensation of transistor 29. At elevated temperatures, the transconductance of transistor 29 increases but the transconductance of transistor 31 decreases. Therefore, the amount of current applied to output 33 during a low-to-high transition remains substantially constant over temperature.

By now it should be appreciated that there has been provided a novel circuit that has a TTL compatible input, that provides high output current, and that has low static power dissipation. Static power dissipation in an input portion of the circuit is reduced by a level shifter that provides an optimum operating voltage to reduce leakage current when a high level TTL signal is applied to the input portion of the circuit. Reducing the input leakage current reduces the circuit's static power dissipation. Employing a restore means ensures that proper internal voltage levels are employed to enable the circuit's operation. Temporarily enabling an output current source only during the circuit's low-to-high transition provides high drive current during the transition while minimizing subsequent static power dissipation.

We claim:

1. A BICMOS circuit having reduced static power dissipation comprising:

a first transistor having a control electrode coupled to an input of the BICMOS circuit, a first current electrode coupled to a voltage return, and a second current electrode coupled to a pull-up node of the BICMOS circuit;

a second transistor having a control electrode coupled to the input of the BICMOS circuit, a first current electrode coupled to the pull-up node, and a second current electrode;

a first diode having a cathode coupled to the second current electrode of the second transistor, and an anode;

a second diode having a cathode coupled to the anode of the first diode, and an anode;

a third diode having a cathode coupled to the anode of the second diode, and an anode coupled to a voltage supply;

a third transistor having a control electrode coupled to the pull-up node, a first current electrode coupled to the voltage return, and a second current electrode;

a fourth transistor having a control electrode coupled to the pull-up node, a first current electrode coupled to the second current electrode of the third transistor, and a second current electrode coupled to the voltage supply;

a fifth transistor having a control electrode coupled to the first current electrode of the fourth transistor, a first current electrode coupled to the voltage supply, and a second current electrode coupled to the pull-up node; and a sixth transistor having a control electrode directly connected to the pull-up node, a first current electrode coupled to the voltage supply, and a second current electrode coupled to an output of the BICMOS circuit.

2. The BICMOS circuit of claim 1 further including a seventh transistor having a control electrode coupled to the input of the BICMOS circuit, a first current electrode coupled to the voltage return, and a second current electrode coupled to the output of the BICMOS circuit.

3. The BICMOS circuit of claim 1 further including a seventh transistor having a control electrode coupled to the first current electrode of the fourth transistor, a first current electrode coupled to the voltage supply, and a second current electrode coupled to the output of the BICMOS circuit.

4. The BICMOS circuit of claim 1 wherein the fifth transistor has a channel length that is approximately three times a channel length of the first transistor.

5. The BICMOS circuit of claim 1 wherein the fourth transistor and the third transistor have a channel width ratio of approximately 1:4.

6. The BICMOS circuit of claim 1 wherein the sixth transistor is a bipolar transistor.

7. A low power dissipation circuit comprising:
a shifter means for shifting a first voltage of a voltage supply to an operating voltage that is lower than the first voltage, the shifter means having an input coupled to the voltage supply, and an output;
an input circuit having an output coupled to a pull-up node, and an input coupled to an input of the low power dissipation circuit wherein the output of the shifter means is coupled to the input circuit so that the input circuit operates from the operating voltage and the output of the the input circuit applies a second voltage to the pull-up node that is less than the operating voltage;
a restore means for restoring the second voltage to a voltage that is greater than the operating voltage wherein the restore means couples the pull-up node to the voltage supply after the second voltage is applied to the pull-up node, the restore means having an input coupled to the pull-up node, and an output; and
a current source having a control input directly connected the pull-up node and a current output coupled to an output of the low power dissipation circuit wherein the current source supplies current to the output of the low power dissipation circuit during a low-to-high transition on the output of the low power dissipation circuit while a voltage value on the output of the low power dissipation circuit is less than a predetermined value.

8. The low power dissipation circuit of claim 7 further including a lower output transistor having a control electrode coupled to the input of the low power dissipation circuit, a first current electrode coupled to the output of the low power dissipation circuit, and a second current electrode coupled to a voltage return.

9. The low power dissipation circuit of claim 7 further including an upper output transistor having a control electrode coupled to the output of the restore means, a first current electrode coupled to the voltage supply, and a second current electrode coupled to the output of the low power dissipation circuit.

10. The low power dissipation circuit of claim 7 wherein the shifter means comprises: a first diode having an anode coupled to the voltage supply, and a cathode; and a second diode having an anode coupled to the cathode of the first diode, and a cathode coupled to the output of the shifter means.

11. The low power dissipation circuit of claim 10 wherein the first diode and the second diode are Schottky diodes, and further including a third Schottky diode in series between the output of the shifter means and the cathode of the second diode, the third Schottky diode having an anode coupled to the cathode of the second diode, and a cathode coupled to the output of the shifter means.

12. The low power dissipation circuit of claim 7 wherein the input circuit comprises: a first transistor having a control electrode coupled to the input of the low power dissipation circuit, a first current electrode coupled to a voltage return, and a second current electrode coupled to the pull-up node; and a second transistor having a control electrode coupled to the input of the low power dissipation circuit, a first current electrode coupled to the output of the shifter means, and a second current electrode coupled to the pull-up node.

13. The low power dissipation circuit of claim 7 wherein the restore means comprises: a first transistor having a control electrode coupled to the pull-up node, a first current electrode coupled to a voltage return, and a second current electrode coupled to the output of the restore means; a second transistor having a control electrode coupled to the pull-up node, a first current electrode coupled to the output of the restore means, and a second current electrode coupled to the voltage supply; and a third transistor having a control electrode coupled to the output of the restore means, a first current electrode coupled to the voltage supply, and a second current electrode coupled to the pull-up node.

14. The low power dissipation circuit of claim 13 wherein the second transistor and the first transistor have a channel width ratio of approximately 1:4.

15. A method of decreasing the power dissipation of a circuit to which a supply voltage level is provided and which receives a TTL logic input signal comprising:
shifting the supply voltage level to an operating voltage level of a predetermined level less than the supply voltage level;
providing the TTL logic input signal to an input of an input circuit having an upper level threshold voltage and an output;
supplying the operating voltage level to the input circuit wherein the operating voltage level minus a voltage of the TTL logic input signal is less than the upper level threshold voltage;
coupling the output of the input circuit to the supply voltage level after a voltage on the output of the input circuit reaches a first predetermined value thereby increasing the voltage on the output of the input circuit; and
enabling a current source, via a direct connection to the output of the input circuit, to supply current to an output of the circuit during a low-to-high transition on the output of the circuit wherein the current source is enabled while a voltage value on the output of the circuit is less than a second predetermined value.

16. The method of claim 15 wherein supplying the operating voltage level includes supplying the operating voltage level that is approximately 1.2 to 1.8 volts less than the supply voltage level.

17. The method of claim 15 wherein enabling the current source to supply current to the output of the circuit during the low-to-high transition on the output of the circuit wherein the current source is enabled while the voltage value on the output of the circuit is less than the second predetermined value includes enabling a bipolar current source transistor to supply current to the output of the circuit during the low-to-high transition on the output of the circuit wherein the bipolar current source transistor is enabled while the voltage value on the output of the circuit is less than approximately 3.6 to 4.8 volts.

* * * * *